United States Patent [19]

Collins et al.

[11] Patent Number: 4,737,688

[45] Date of Patent: Apr. 12, 1988

[54] WIDE AREA SOURCE OF MULTIPLY IONIZED ATOMIC OR MOLECULAR SPECIES

[75] Inventors: George J. Collins; Zeng-gi Yu, both of Ft. Collins, Colo.

[73] Assignee: Applied Electron Corporation, Albuquerque, N. Mex.

[21] Appl. No.: 888,501

[22] Filed: Jul. 22, 1986

[51] Int. Cl.⁴ .......................... H05H 1/02; H05H 1/03
[52] U.S. Cl. ........................... 315/111.21; 315/111.31; 315/111.81; 315/111.91; 313/362.1; 313/361.1
[58] Field of Search .................. 313/361.1, 362.1, 7; 315/111.81, 111.91, 111.21, 111.31; 250/427

[56] References Cited

U.S. PATENT DOCUMENTS

| | | | |
|---|---|---|---|
| 3,296,481 | 1/1967 | Peters | 250/427 X |
| 3,430,091 | 2/1969 | Davis | 313/619 X |
| 3,955,118 | 5/1976 | Flemming | 315/111.81 |
| 3,970,892 | 7/1976 | Wakalopulos | 315/111.31 |
| 4,339,691 | 7/1982 | Morimiya et al. | 315/111.21 |
| 4,574,179 | 3/1986 | Masuzawa et al. | 315/111.31 X |
| 4,642,522 | 2/1987 | Harvey et al. | 315/111.81 X |
| 4,645,978 | 2/1987 | Harvey et al. | 315/111.81 |
| 4,652,795 | 3/1987 | Lee et al. | 315/111.81 X |

Primary Examiner—David K. Moore
Assistant Examiner—Michael Horabik
Attorney, Agent, or Firm—William E. Hein

[57] ABSTRACT

Apparatus for generating multiply charged ions from a source of wide area for use in ion implantation is based upon electron beam plasma interactions which more efficiently create a large density of multiply ionized species than conventional plasma sources over a wide area (1–20 cm in diameter). The beam electrons are generated from a glow discharge electron gun operating in the abnormal glow discharge state. More multiply ionized species are created because of the larger number of electrons at high energy present in a beam created discharge as compared to conventional hollow cathode or thermionic cathode ion sources. By using a ring-shaped cold cathode beam electron generator it is possible to realize a wide area source 2–20 cm in diameter. This multiple ion source permits the realization of a fixed ion implantation energy using a lower electrostatic potential because multiply ionized species are accelerated rather than singly ionized species.

19 Claims, 2 Drawing Sheets

WIDE AREA SOURCE OF MULTIPLY IONIZED ATOMIC OR MOLECULAR SPECIES

BACKGROUND OF THE INVENTION

Moderate energy (10-100 KV) ion implantation is commonly used in the material processing arts for surface modification of materials and for shallow implants. High energy (0.1 to 2 MeV) ion implantation has recently become a very important process for the placement of atoms further into the bulk material. The energy of an ion accelerated through a potential difference V is given by QV, where Q is the ion charge and V the applied accelerating voltage.

Conventional ion sources are based on either thermionic cathodes or hollow cathode discharges, both of which act as the source of electrons for a plasma discharge. The accelerated electrons in turn create ions by way of electron-gas collisions. These conventional ion sources are characterized by plasma conditions with average electron temperatures, $T_e$, of 1-10 eV and electron densities of $10^9$ to $10^{12}$ electrons/cubic centimeter. Average electron energies at or below 10 eV for the conventional sources produce a low ratio of multiple to single ionized species due to the small overlap of the 10 eV electron energy distribution with the cross sections for multiple ion formation.

The density of multiply ionized atomic or molecular species is so low in conventional ion sourses that the multiple ion current one can extract is typically $10^3$ times less than that of single ions. Note that for a multiple ion of charge nQ, acceleration in a potential V results in an energy of nQV. Hence, for equal energies the potential required for an ion of charge nQ is V/n. The use of multiply ionized atomic or molecular species for ion implantation allows for higher energy implantation with a fixed accelerator voltage than when using singly ionized atomic or molecular species. Alternatively, using multiply ionized species nQ, one can use a lower accelerating voltage V/n and still realize the same ion energy as that of a single ion at the full voltage. This condition allows a MeV implanter to operate at 500 KV or a 500 KV implanter to operate at 250 KV if doubly ionized atomic or molecular species are used. Even lower accelerating voltages are possible with higher states of ionization such as $A^{+3}$ or $A^{+4}$.

For singly ionized atomic or molecular species, the full potential V must be applied to accelerate them to an energy eV. As V exceeds several hundred kilovolts, high voltage design of the acceleration apparatus and associated power supplies becomes costly both in terms of the high voltage requirements on electronic parts and modification necessary to control high voltage breakdown and arcing.

SUMMARY OF THE INVENTION

The present invention relates to a new apparatus and method for generating multiply charged ions from a wide area source for use in ion implantation of material surfaces. A conventional ion implanter includes three major components. These are an ion source, an ion selector, and a final ion accelerator. The present invention pertains only to the ion source and is based upon electron beam plasma interactions which create a large density of multiply ionized atomic or molecular species more efficiently than conventional hollow cathode or thermionic cathode ion sources over a wide area (1-20 cm in diameter). The beam electrons are generated from a glow discharge electron gun operating in the abnormal glow discharge state. A higher density of multiply ionized atomic or molecular species is created because of the large number of electrons at high energy present in a beam created discharge as compared to conventional thermionic and hollow cathode ion sources, as described below.

In the beam created plasma of a glow discharge electron gun, the high energy electron energy distribution together with the high (0.1-30 Torr) operating pressure permits increased multiple ion production as compared to conventional sources with lower electron energy (1-10 eV) operating at lower pressures ($10^{-4}$ to $10^{-1}$ Torr). When the glow discharge electron gun is configured to have a ring-shaped cold cathode geometry a wide area multiple ion source (1-20 cm diameter) results. Cylindrical, spherical, rectangular, and other geometries are also possible. The multiply ionized atomic or molecular species present in the beam created plasma are extracted from that plasma by one or more accelerating grids. The extraction of multiply charged atomic or molecular species occurs more efficiently that for singly ionized species, even at high operating pressure, as explained below.

Multiply ionized atomic or molecular species do not undergo resonant charge transfer with ground state neutrals as do singly ionized species. Hence, multiply ionized atomic or molecular species have a longer ion mean free path in a neutral gas between extraction grids, or in the plasma sheath region than singly ionized species which are subject to resonant charge transfer. Resonant charge transfer ion-neutral cross sections are typically 10 to 100 times larger than elastic ion-neutral cross sections. Hence, the mean free path between collisions of singly ionized atomic or molecular species is 1/10 or 1/100 the size of that or multiply ionized atomic or molecular species. Long mean free paths increase the extraction efficiency of multiply ionized atomic or molecular species from plasmas using one or more extraction grids. Separation and filtering of multiply ionized and singly ionized atomic or molecular species, nQ, can also be done in a highly efficient charge/mass transmission filter because of the large difference (n) in such ratios. Ion filtering occurs at a lower ambient pressure, typically $10^{-4}$ Torr.

In summary, use of an electron beam plasma ion source permits the generation and extraction of a higher current of multiply ionized atomic or molecular species than was previously possible using conventional hollow cathode or thermionic cathode ion sources. A wide area structure for the new multiple ion source is also possible via the use of a cold cathode having a ring-shaped structure, which facilitates the realization of a disc-shaped open source of multiply ionized atomic or molecular species. Finally, using proper non-reactive cold cathode materials, the ion source can operate in highly corrosive electronegative gases such as chlorine or flourine, where both positive and negative ions may be formed.

DESCRIPTION OF THE ILLUSTRATED EMBODIMENT OF THE INVENTION

Figure 1:
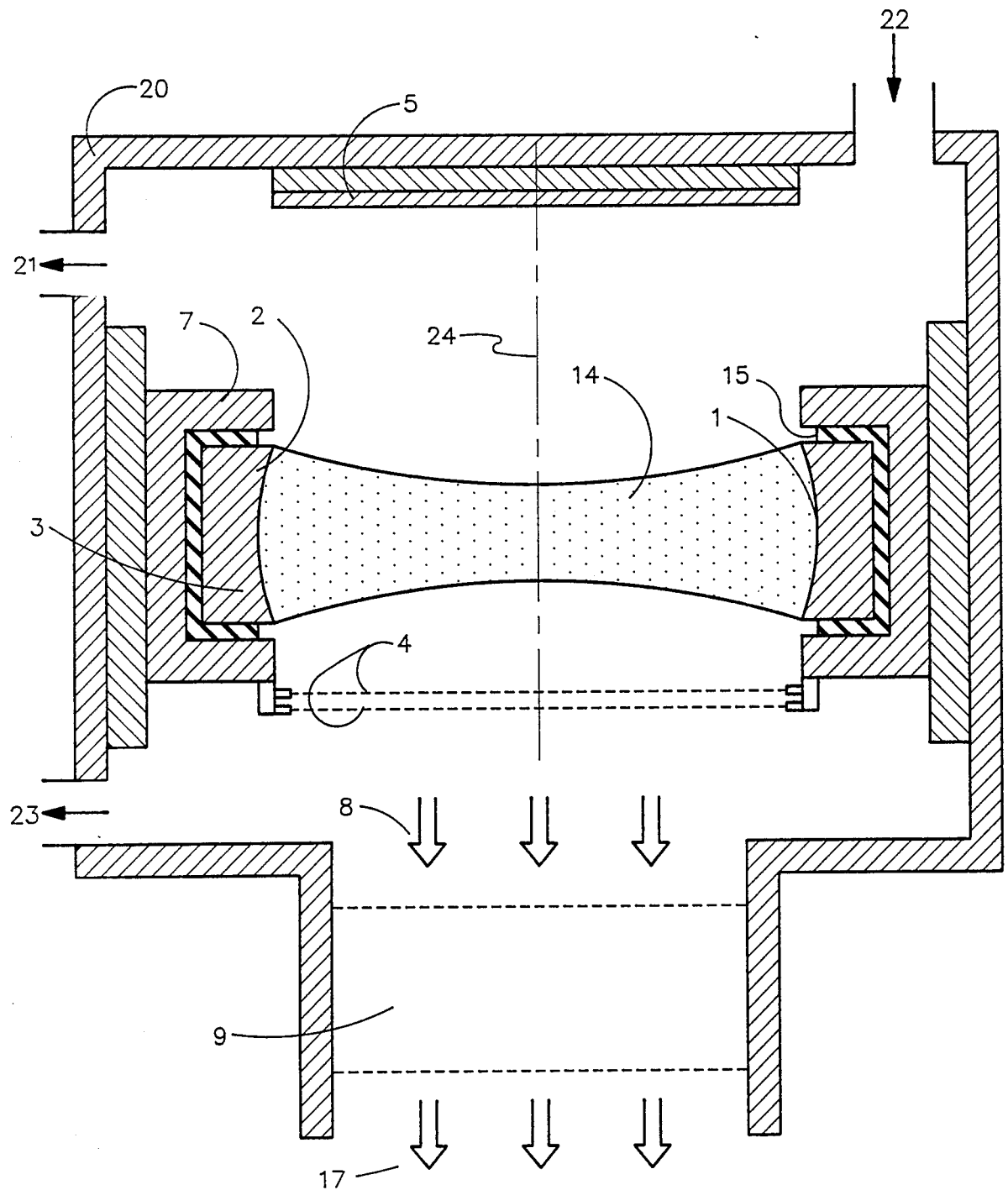
FIG. 1 is an illustration in cross-section of a ring-shaped cold cathode glow discharge electron gun, ion reflecting electrode, extraction grids, and ion selector employed to create a wide area source of multiply ionized atomic or molecular species in accordance with the teachings of the present invention.

Referring now to FIG. 1, there is shown a cross-sectional pictorial representation of a cold cathode abnormal glow discharge electron gun having a ring-shaped cold cathode 2 having a concave shaped front or inner surface that is operative for generating secondary electrons via ion bombardment. The ring-shaped cold cathode 2, having a circular axis 24, includes a front surface 1 that is constructed of corrosion resistant materials having a high secondary electron emission coefficient and low sputter yield. Secondary electrons are accelerated by a cathode sheath electric field to become energetic beam electrons. The ring-shaped cold cathode 2 defines an electrostatic field which will focus the beam electrons in a disc-like plasma 14. A ring-shaped metal or ceramic insulating cathode shell 7 serves to shield the outer surface of the ring-shaped cold cathode 2 from ion bombardment and thereby confines emission of electrons therefrom to only the inner front surface 1 of the ring-shaped cold cathode 2 to form the spatially confined disc-shaped electron beam created plasma 14. An insulating spacer 15 (0.1 to 0.5 mm in thickness) constructed of a machinable material such as aluminum oxide, beryllium oxide or Mycor is used if the cathode shell 7 is constructed of a metallic material. Cathode shell 7 also acts as a structure to which one or more ion extraction grids 4 may be mechanically attached. Extraction grids 4 may be constructed of carbon, titanium or silicon. Although the extraction grids 4 are mechanically attached to cathode shell 7 they are electrically isolated therefrom by conventional means. As compared to prior art hollow cathode or thermionic cathode based ion sources which operate typically at $10^{-4}$ to $10^{-1}$ Torr, the glow discharge electron gun of the present invention operates in the 0.1 to 30 Torr pressure region. The desired pressure is created within an ion source chamber 20 that includes a differentially pumped source vacuum port 21 and a source gas port 22 that is coupled to an external vacuum control means and an external differential pumping means and is operative for admitting and controlling the flow of selected atomic or molecular feedstock gases into the chamber 20. Differential vacuum pumping using conventional means creates a pressure of $10^{-2}$ to $10^{-4}$ Torr in the region beyond the ion extraction grids 4. A conventional high vacuum port 23 is used to reduce the ambient pressure to within $10^{-2}$ to $10^{-4}$ Torr in a region of total ion flux 8.

The focussed beam electrons interact efficiently with ambient atomic or molecular gaseous species to create a high density of doubly ionized atomic or molecular species as well as singly ionized species. A small portion of the ionized species diffuse into the cathode sheath adjacent to the relatively small area inner surface 1 of the ring-shaped cold cathode 2 and bombard the front surface 1 to generate the secondary electrons which sustain the plasma 14. However, a large portion of the ionized species diffuse to a large open area adjacent the plasma 14 where they may be extracted by one or more ion extraction grids 4 to provide an area of total ion flux 8.

In the present invention, beam electrons are energized to average energies of several hundred electron volts where the electron-gas cross section for multiple ionization is large. Hence, more multiply ionized atomic or molecular species are created than is possible using conventional hollow cathode or thermionic cathode ion sources which have average electron energies of 1–10 electron volts. The ring-shaped cathodes of smaller diameter tend to have higher electron energy plasmas due to the fact that the electron mean free path is approaching the ring diameter and a trapped beam results. A solid planar shaped ion reflecting electrode 5 that may comprise a non-reactive metal plate or a non-reactive metal ceramic plate is employed to reflect the ion flux from the side of plasma 14 that is opposite to extraction grids 4 to enhance the extraction of ions from the plasma 14. A total ion flux 8 passes through a Q/M ion selector 9 to select from the total ion flux 8 an isolated beam of selected ions 17 to be sent on to a conventional final ion accelerator, which is not illustrated. Conventional differential vacuum pumping reduces the pressure in the ion selector 9 to the $10^{-2}$ to $10^{-4}$ Torr region through a conventional high vacuum port 23.

Figure 2:
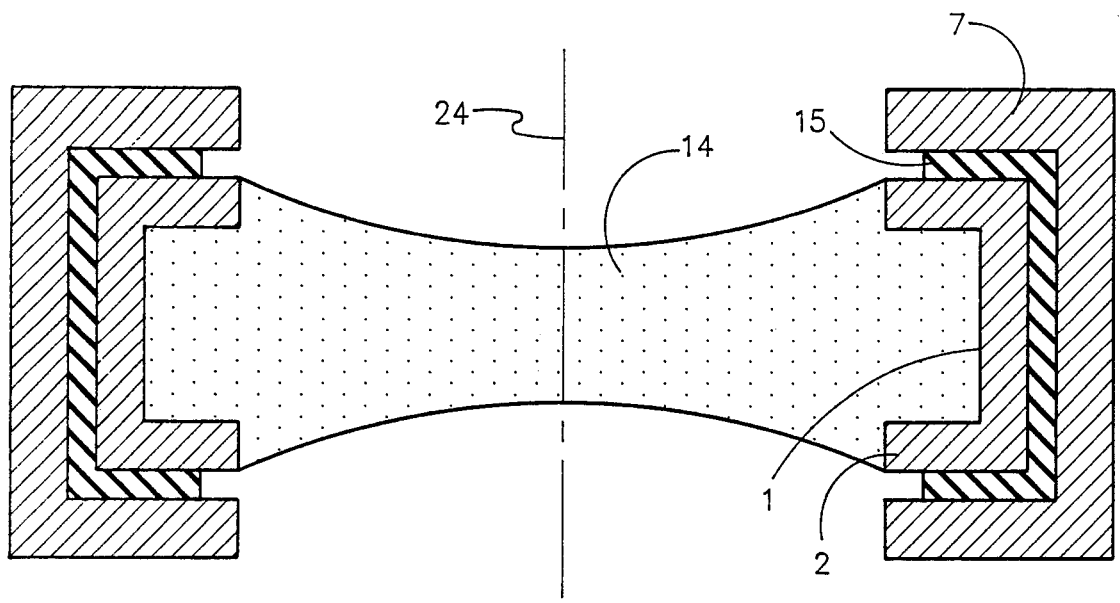
FIG. 2 illustrates an alternative geometry for the ring-shaped cold cathode glow discharge electron gun of FIG. 1.

Referring to FIG. 2, there is shown a cross-sectional pictorial representation of a ring-shaped cold cathode abnormal glow discharge electron gun as in FIG. 1 except that the concave front surface 1 of ring-shaped cold cathode 2 has been replaced, as illustrated in FIG. 2, with a U-shaped front surface 1. Otherwise, the apparatus of FIG. 2 functions in accordance with the description above of FIG. 1.

Figure 3:
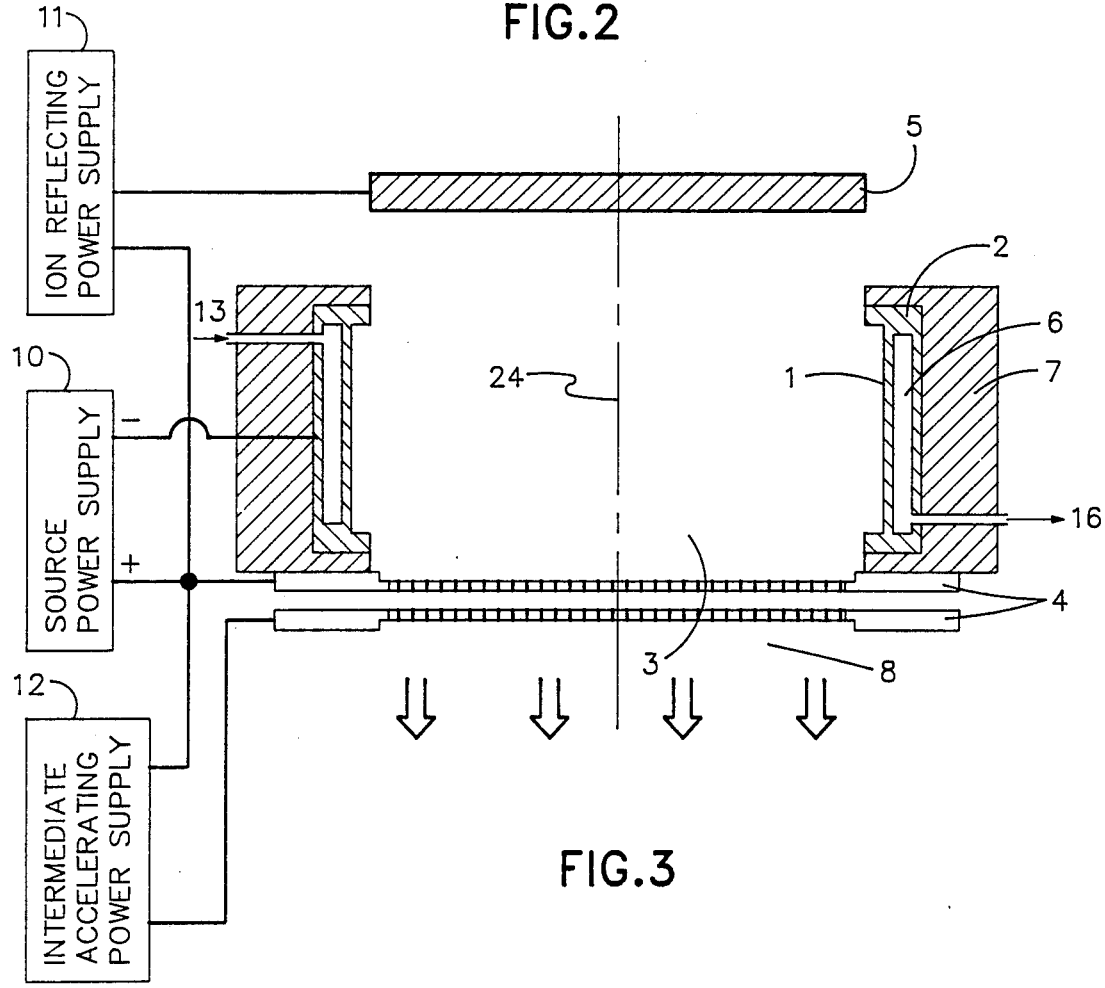
FIG. 3 illustrates the cathode cooling and the relative electrical potentials on the ring-shaped cold cathode discharge electron gun, extraction grids, ion reflecting electrode, and ion selector illustrated in FIG. 1.

FIG. 3 shows cooling and electrical feedthrough connections for the apparatus illustrated in FIGS. 1 and 2. A negative potential is applied to the ring-shaped cold cathode 2 by source power supply 10. A conventional cooling cavity 6, including a liquid or gas inlet 13 and an outlet 16 is formed within the ring-shaped cold cathode 2 to remove the thermal energy arising from ion bombardment during operation of the apparatus. A liquid, such as water, or a conventional gas coolant may be circulated within the cooling cavity 6 for the purpose of cooling the ring-shaped cold cathode 2. An ion reflecting power supply 11, connected to ion reflecting electrode 5, appropriately biases ion reflecting electrode 5 so that a larger fraction of the total ion flux 8 created by plasma 14 is directed toward extraction grids 4. The reflecting electrode 5 work equally well for positive and negative ions, provided appropriate power supply polarities are observed. An intermediate accelerating power supply 12, connected between extraction grids 4, imparts a total energy (QV or nQV) to the components of the total ion flux 8. The total ion flux 8 includes both singly ionized (Q) and multiply ionized (nQ) atomic or molecular species which subsequently pass through a Q/M ion selector 9. The resultant selected ion flux 17 is then accelerated toward a conventional final ion accelerator, not illustrated.

We claim:

1. Apparatus for providing a wide area source of multiply ionized atomic or molecular species, the apparatus comprising:

vacuum chamber means;

a ring-shaped cold cathode within said vacuum chamber means having a geometrically shaped front surface comprising a material selected for the efficient emmission of secondary electrons and for minimum cathode sputtering, said ring-shaped cold cathode being operative in the abnormal glow discharge state for generating a disc-like plasma;

a ring-shaped cathode shell coaxially covering an outer surface of said ring-shaped cold cathode;

a solid planar ion reflecting electrode positioned substantially perpendicular to a circular axis of said ring-shaped cold cathode to reduce the escape of ions from an adjacent first surface of the disc-like plasma;

one or more extraction grids positioned adjacent a second surface of said disc-like plasma for extracting and accelerating a total ion flux from that surface of said disc-like plasma;

an ion selector positioned in the path of the total ion flux extracted from the disc-like plasma for selecting a beam of specific ions from the total ion flux;

power supply means for applying desired voltages to the ring-shaped cold cathode, ion reflecting electrode, and extraction grids;

vacuum control means coupled to said vacuum chamber means for establishing and maintaining a desired vacuum within the range of 1.0 to 30 Torr within a volume enclosed by said vacuum chamber means that is adjacent said ring-shaped cold cathode;

differential pumping means coupled to said vacuum chamber means for establishing a differential pressure between a volume enclosed by said vacuum chamber means that is adjacent the ring-shaped cold cathode and another volume that is adjacent the ion selector; and gas port means coupled to said vaccum control means and to said differential pumping means for admitting and controlling the flow of selected atomic or molecular feedstock gases into said vacuum chamber means.

2. Apparatus as in claim 1 wherein the front surface of said ring-shaped cold cathode is formed to be concave for electrostatically focussing the disc-like plasma.

3. Apparatus as in claim 1 where the front surface of said ring-shaped cold cathode is formed to be a U-shaped slot for electrostatically focussing the disc-like plasma.

4. Apparatus as in claim 1 further comprising coolant means for circulating a coolant within said ring-shaped cold cathode.

5. Apparatus as in claim 4 wherein the coolant comprises water.

6. Apparatus as in claim 4 wherein the coolant comprises a gas.

7. Apparatus as in claim 1 wherein said ring-shaped cathode shell is constructed of a ceramic material.

8. Apparatus as in claim 1 wherein:
said ring-shaped cathode shell is constructed of a metal and is spaced from said ring-shaped cold cathode a uniform distance; and
the uniform distance by which said ring-shaped cold cathode is spaced from said ring-shaped cathode shell is occupied by an insulating material.

9. Apparatus as in claim 8 wherein said insulating material is a machinable material.

10. Apparatus as in claim 8 wherein said insulating material is aluminum oxide.

11. Apparatus as in claim 8 wherein said insulating material is beryllium oxide.

12. Apparatus as in claim 1 further comprising coolant means for circulating a coolant within said ring-shaped cold cathode.

13. Apparatus as in claim 12 wherein the coolant comprises water.

14. Apparatus as in claim 12 wherein the coolant comprises a gas.

15. Apparatus as in claim 1 wherein the ion reflecting electrode comprises a non-reactive metal plate.

16. Apparatus as in claim 1 wherein the ion reflecting electrode comprises a non-reactive metal ceramic plate.

17. Apparatus as in claim 1 wherein the one or more extraction grids comprise carbon.

18. Apparatus as in claim 1 wherein the one or more extraction grids comprise titanium.

19. Apparatus as in claim 1 wherein the one or more extraction grids comrpise silicon.

* * * * *